US012610853B2

(12) United States Patent
Fujita et al.

(10) Patent No.: US 12,610,853 B2
(45) Date of Patent: Apr. 21, 2026

(54) CURABLE COMPOSITION FOR INKJET AND AIR CAVITY FORMATION, ELECTRONIC COMPONENT, AND METHOD FOR MANUFACTURING ELECTRONIC COMPONENT

(71) Applicant: SEKISUI CHEMICAL CO., LTD., Osaka-city (JP)

(72) Inventors: Yusuke Fujita, Osaka (JP); Takashi Watanabe, Osaka (JP); Mitsuru Tanikawa, Osaka (JP); Yoshifumi Sugisawa, Osaka (JP); Tomoya Tanaka, Osaka (JP); Takanori Inoue, Osaka (JP); Taichi Hamada, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 381 days.

(21) Appl. No.: 18/279,446

(22) PCT Filed: Apr. 14, 2022

(86) PCT No.: PCT/JP2022/017861
§ 371 (c)(1),
(2) Date: Aug. 30, 2023

(87) PCT Pub. No.: WO2022/220289
PCT Pub. Date: Oct. 20, 2022

(65) Prior Publication Data
US 2024/0136239 A1 Apr. 25, 2024
US 2024/0234226 A9 Jul. 11, 2024

(30) Foreign Application Priority Data
Apr. 15, 2021 (JP) .............................. JP2021-069237

(51) Int. Cl.
*H01L 23/29* (2006.01)
*B41M 3/00* (2006.01)
(Continued)

(52) U.S. Cl.
CPC ........... *H01L 23/293* (2013.01); *B41M 3/008* (2013.01); *B41M 5/0047* (2013.01);
(Continued)

(58) Field of Classification Search
CPC ... H01L 23/293; B41M 3/008; B41M 5/0047; B41M 7/0081; B41M 7/009; C09D 11/107
See application file for complete search history.

(56) References Cited

U.S. PATENT DOCUMENTS

2015/0247055 A1* 9/2015 Takahashi ............ C09D 11/328
522/39
2018/0062618 A1 3/2018 Nagarkar et al.

FOREIGN PATENT DOCUMENTS

JP 2010-278971 12/2010
JP 2014-237814 12/2014
(Continued)

OTHER PUBLICATIONS

International Preliminary Report on Patentability and Written Opinion of the International Searching Authority issued Oct. 12, 2023 in International (PCT) Application No. PCT/JP2022/017861.
(Continued)

*Primary Examiner* — Nathan T Leong
(74) *Attorney, Agent, or Firm* — Wenderoth, Lind & Ponack, L.L.P.

(57) ABSTRACT

Provided is a curable composition for inkjet and air cavity formation, the curable composition capable of forming a cured product layer having a high aspect ratio and capable of enhancing adhesiveness and sealability. A curable com-
(Continued)

10 position for inkjet and air cavity formation according to the present invention contains a photocurable compound having a (meth)acryloyl group or a vinyl group and having no cyclic ether group, and a thermosetting compound having no (meth)acryloyl group and having a cyclic ether group, in which a content of the thermosetting compound in 100 wt % of the curable composition for inkjet and air cavity formation is 5 wt % or more, and when a B-staged product is obtained by irradiating the curable composition for inkjet and air cavity formation with light having a wavelength of 365 nm at an illuminance of 2000 mW/cm$^2$, a viscosity at 40° C. of the B-staged product is $2.5\times10^2$ Pa·s or more and $3.0\times10^\varepsilon$ Pa·s or less.

9 Claims, 3 Drawing Sheets

(51) Int. Cl.

| | | |
|---|---|---|
| *B41M 5/00* | (2006.01) | |
| *B41M 7/00* | (2006.01) | |
| *C09D 11/107* | (2014.01) | |
| *C09D 11/38* | (2014.01) | |
| *H01L 21/56* | (2006.01) | |
| *H01L 23/31* | (2006.01) | |
| *H01L 23/00* | (2006.01) | |

(52) U.S. Cl.
CPC .......... *B41M 7/0081* (2013.01); *B41M 7/009* (2013.01); *C09D 11/107* (2013.01); *C09D 11/38* (2013.01); *H01L 21/56* (2013.01); *H01L 23/315* (2013.01); *H01L 23/3121* (2013.01); *H01L 24/16* (2013.01); *H01L 2224/16225* (2013.01)

(56) References Cited

FOREIGN PATENT DOCUMENTS

| | | | |
|---|---|---|---|
| JP | 2016-216725 | | 12/2016 |
| JP | 2018-67676 | | 4/2018 |
| JP | 2018067676 | * | 4/2018 |
| JP | 2018-74566 | | 5/2018 |
| WO | 2014/050688 | | 4/2014 |

OTHER PUBLICATIONS

International Search Report (ISR) issued Jul. 5, 2022 in International (PCT) Application No. PCT/JP2022/017861.

* cited by examiner

[FIG. 1]
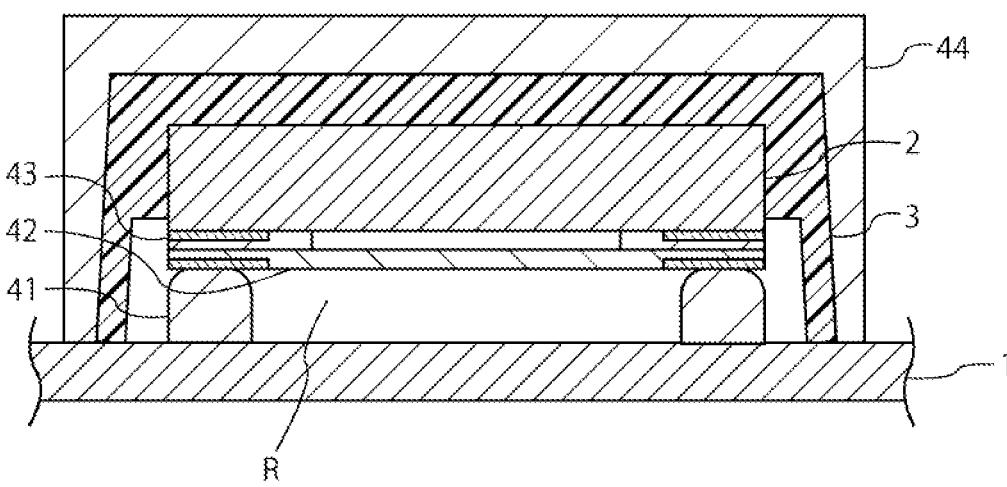

[FIG. 2]
(a)
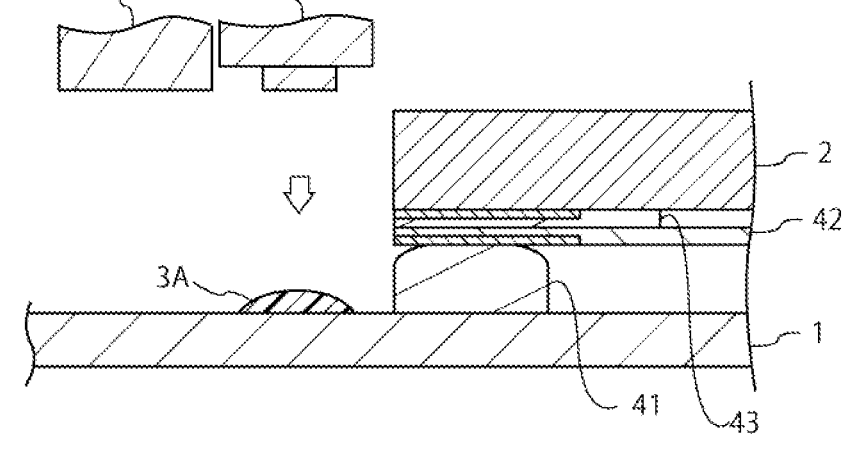
(b)
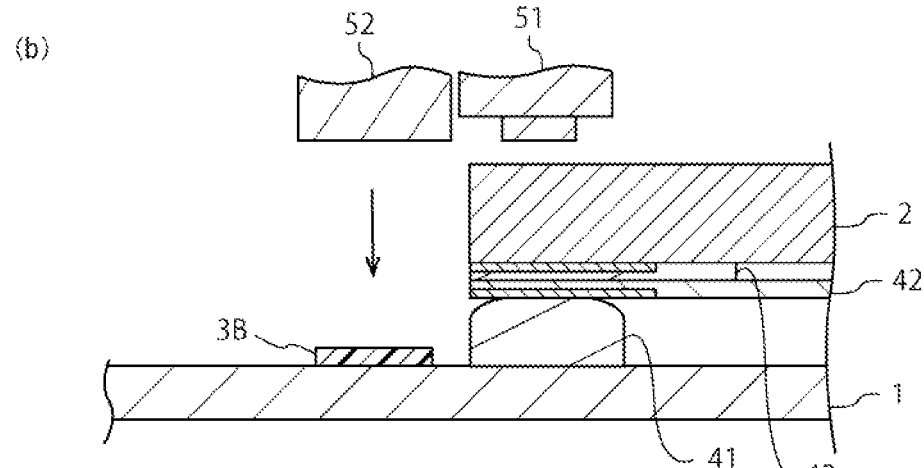
(c)
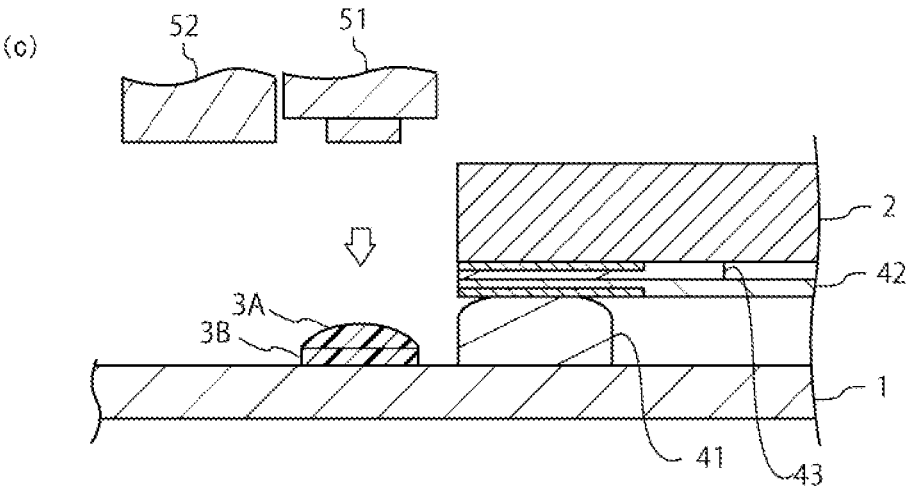

[FIG. 3]
(d)
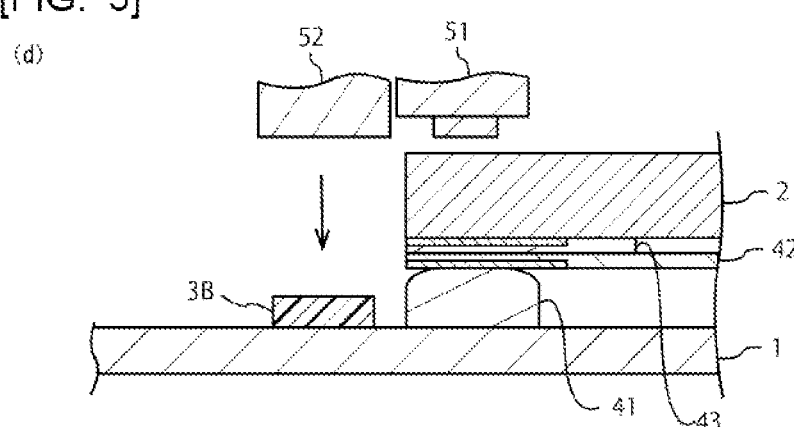
(e)
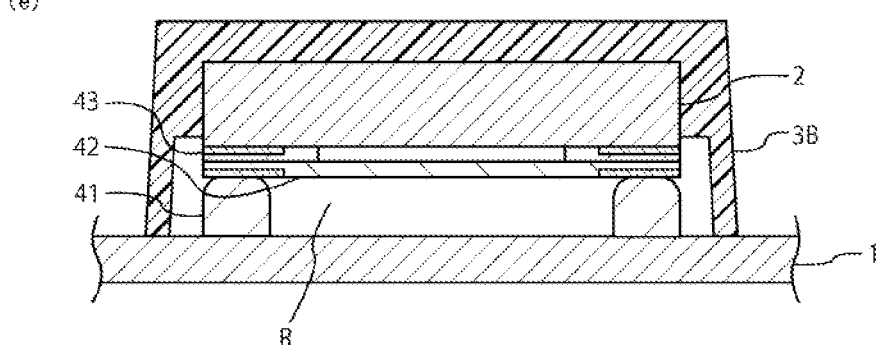
(f)
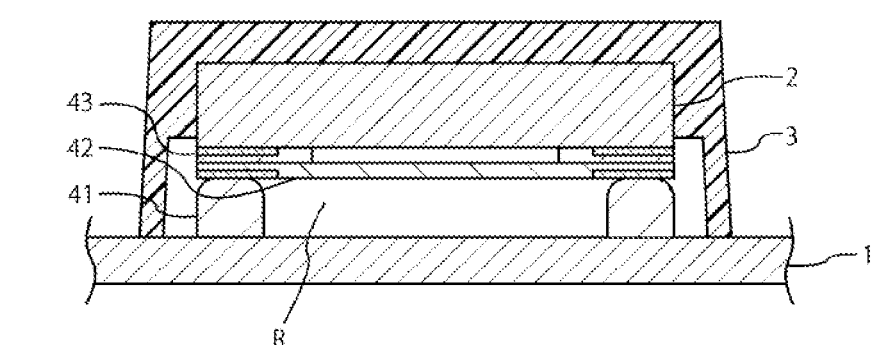
(g)
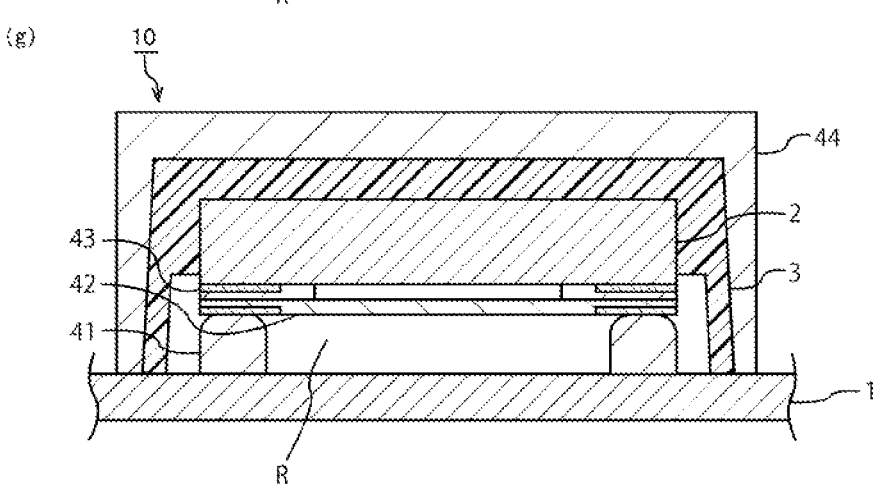

CURABLE COMPOSITION FOR INKJET AND AIR CAVITY FORMATION, ELECTRONIC COMPONENT, AND METHOD FOR MANUFACTURING ELECTRONIC COMPONENT

TECHNICAL FIELD

The present invention relates to a curable composition for inkjet and air cavity formation which is applied and used using an inkjet device. The present invention also relates to an electronic component using the curable composition and a method for manufacturing an electronic component.

BACKGROUND ART

An RDL layer and an air cavity (space) formed of a metal or the like are present in a communication filter. Conventionally, the air cavity is formed using a sheet material such as a photosensitive polyimide resin sheet and an epoxy resin sheet (for example, Patent Document 1 below).

RELATED ART DOCUMENT

Patent Document

Patent Document 1: JP 2010-278971 A

SUMMARY OF THE INVENTION

Problems to be Solved by the Invention

The manufacturing cost of the conventional method for forming an air cavity using a sheet material is high, and the manufacturing process is also complicated. In the conventional method for forming an air cavity using a sheet material, when a peripheral portion of a filter structure is molded with a resin, the resin may penetrate the sheet material and enter the air cavity. In order to improve the reliability of the communication filter, it is necessary that the resin does not enter the air cavity, and thus, more excellent sealability is required. When the air cavity can be favorably formed by a method other than the method using the sheet material, this contributes to reduction of the manufacturing cost and simplification of the manufacturing process.

As such a method, a method for forming an air cavity by applying a curable composition to a predetermined region using an inkjet device and curing the applied curable composition is conceivable. For example, if an upper surface of a first member (lower member) and a side surface or a lower surface of a second member (upper member) can be bonded by a cured product layer of the curable composition, an air cavity can be formed by the first member, the second member, and the cured product layer. As the performance of the curable composition for inkjet used for air cavity applications, the performance capable of increasing an aspect ratio of the cured product layer, the performance capable of enhancing an adhesive force between the first and second members and the cured product layer, and the performance capable of enhancing sealability are required.

However, in the conventional curable composition for inkjet, it is difficult to form a cured product layer having a high aspect ratio. In the conventional curable composition for inkjet, it is difficult to enhance the adhesive force between the cured product layer of the curable composition and the members. In the conventional curable composition for inkjet, the curable composition may come into contact with an electronic component disposed around a member such as a communication filter, and sealability may be deteriorated. For this reason, it is difficult to use the conventional curable composition for inkjet for forming an air cavity.

An object of the present invention is to provide a curable composition for inkjet and air cavity formation, the curable composition capable of forming a cured product layer having a high aspect ratio and capable of enhancing adhesiveness and sealability. An object of the present invention is also to provide an electronic component using the curable composition and a method for manufacturing an electronic component using the curable composition.

Means for Solving the Problems

According to a broad aspect of the present invention, there is provided a curable composition for inkjet and air cavity formation (hereinafter, abbreviated as "curable composition" in some cases), containing: a photocurable compound having a (meth)acryloyl group or a vinyl group and having no cyclic ether group; and a thermosetting compound having no (meth)acryloyl group and having a cyclic ether group, a content of the thermosetting compound in 100 wt % of the curable composition for inkjet and air cavity formation being 5 wt % or more, and when a B-staged product is obtained by irradiating the curable composition for inkjet and air cavity formation with light having a wavelength of 365 nm at an illuminance of 2000 mW/cm², a viscosity at 40° C. of the B-staged product being $2.5 \times 10^2$ Pa·s or more and $3.0 \times 10^6$ Pa·s or less.

In a specific aspect of the curable composition according to the present invention, the photocurable compound includes a first photocurable compound having one, in total, of a (meth)acryloyl group and a vinyl group and a second photocurable compound having two or more, in total, of a (meth)acryloyl group and a vinyl group.

In a specific aspect of the curable composition according to the present invention, the first photocurable compound is a photocurable compound having one (meth)acryloyl group, and the second photocurable compound is a photocurable compound having two or more (meth)acryloyl groups.

In a specific aspect of the curable composition according to the present invention, the curable composition contains or does not contain a photocurable and thermosetting compound having a (meth)acryloyl group and having a cyclic ether group, when the curable composition does not comprise the photocurable and thermosetting compound, a content of the second photocurable compound in 100 wt % of the photocurable compound is 5 wt % or more and 25 wt % or less, and when the curable composition comprises the photocurable and thermosetting compound, a content of the second photocurable compound in 100 wt % of a total content of the photocurable compound and the photocurable and thermosetting compound is 4 wt % or more and 20 wt % or less.

In a specific aspect of the curable composition according to the present invention, the curable composition contains a thermal curing agent.

In a specific aspect of the curable composition according to the present invention, the thermal curing agent contains an amine compound.

According to a broad aspect of the present invention, there is provided an electronic component including: a first member; a second member; and a bonding portion bonding an upper surface of the first member and a side surface or a lower surface of the second member, an air cavity being formed by the first member, the second member, and the bonding portion, and the bonding portion being a cured product of the aforementioned curable composition for inkjet and air cavity formation.

In a specific aspect of the electronic component according to the present invention, a ratio of a height of the bonding portion to a width of the bonding portion is 1.0 or more.

According to a broad aspect of the present invention, there is provided a method for manufacturing an electronic component, including: an application step of applying the aforementioned curable composition onto a surface of a first member using an inkjet device to form a curable composition layer, a photocuring step of allowing curing of the curable composition layer to proceed by light irradiation to form a B-staged product layer, and a thermal curing step of thermally curing the B-staged product layer by heating, in the application step and the photocuring step, application and photocuring being repeated in a thickness direction of the curable composition layer to form a B-staged product layer in contact with a side surface or a lower surface of a second member.

Effect of the Invention

The curable composition for inkjet and air cavity formation according to the present invention contains a photocurable compound having a (meth)acryloyl group or a vinyl group and having no cyclic ether group, and a thermosetting compound having no (meth)acryloyl group and having a cyclic ether group. A content of the thermosetting compound in 100 wt % of the curable composition for inkjet and air cavity formation according to the present invention is 5 wt % or more. In the curable composition for inkjet and air cavity formation according to the present invention, when a B-staged product is obtained by irradiating the curable composition for inkjet and air cavity formation with light having a wavelength of 365 nm at an illuminance of 2000 mW/cm², a viscosity at 40° C. of the B-staged product is 2.5×10² Pa·s or more and 3.0×10⁶ Pa·s or less. Since the curable composition for inkjet and air cavity formation according to the present invention has the above configuration, a cured product layer having a high aspect ratio can be formed, and adhesiveness and sealability can be enhanced.

BRIEF DESCRIPTION OF DRAWINGS

FIG. 1 is a cross-sectional view schematically illustrating an electronic component obtained using a curable composition for inkjet and air cavity formation according to a first embodiment of the present invention.

FIGS. 2(a) to 2(c) are cross-sectional views for describing each step of a method for manufacturing the electronic component illustrated in FIG. 1.

FIGS. 3(d) to 3(g) are cross-sectional views for describing each step of the method for manufacturing the electronic component illustrated in FIG. 1.

MODE (S) FOR CARRYING OUT THE INVENTION

Hereinafter, the present invention will be described in detail.
(Curable Composition for Inkjet and Air Cavity Formation)

A curable composition for inkjet and air cavity formation according to the present invention (hereinafter, abbreviated as "curable composition" in some cases) is applied and used using an inkjet device upon use, The curable composition according to the present invention is different from a curable composition which is to be applied by screen printing, and is different from a curable composition which is to be applied with a dispenser.

The curable composition according to the present invention contains a photocurable compound having a (meth) acryloyl group or a vinyl group and having no cyclic ether group, and a thermosetting compound having no (meth) acryloyl group and having a cyclic ether group. A content of the thermosetting compound in 100 wt % of the curable composition according to the present invention is 5 wt % or more.

In the present specification, the "photocurable compound having a (meth)acryloyl group or a vinyl group and having no cyclic ether group" may be referred to as "(A) photocurable compound".

In the present specification, the "thermosetting compound having no (meth)acryloyl group and having a cyclic ether group" may be referred to as "(B) thermosetting compound".

Therefore, the curable composition according to the present invention contains (A) a photocurable compound and (B) a thermosetting compound, and a content of the (B) thermosetting compound in 100 wt % of the curable composition according to the present invention is 5 wt % or more.

In the curable composition according to the present invention, when a B-staged product is obtained by irradiating the curable composition with light having a wavelength of 365 nm at an illuminance of 2000 mW/cm², a viscosity at 40° C. of the B-staged product is 2.5×10² Pa·s or more and 3.0×10⁶ Pa·s or less.

Since the curable composition according to the present invention has the above configuration, a cured product layer having a high aspect ratio can be formed, and adhesiveness and sealability can be enhanced. In the curable composition according to the present invention, a cured product layer having a large ratio of a height to a width can be formed. In the curable composition according to the present invention, since a cured product layer having a high aspect ratio can be formed, a distance between members to be bonded (a distance between a first member and a second member) can be controlled to a desired distance. In the curable composition according to the present invention, an adhesive strength between the members to be bonded (the first member and the second member) and a cured product (bonding portion) of the curable composition can be further enhanced. Therefore, in the curable composition according to the present invention, for example, an air cavity can be favorably formed by the first member (lower member), the second member (upper member), and the bonding portion formed by the cured product of the curable composition. In an electronic component in which an air cavity is formed using the curable composition according to the present invention, even when a reflow step is performed, peeling hardly occurs between the first and second members and the bonding portion.

The curable composition according to the present invention may or may not contain a photocurable and thermosetting compound having a (meth)acryloyl group and having a cyclic ether group.

In the present specification, the "photocurable and thermosetting compound having a (meth)acryloyl group and having a cyclic ether group" may be referred to as "(C) photocurable and thermosetting compound".

Since the curable composition contains the (A) photocurable compound and the (B) thermosetting compound, the curable composition is a photocurable and thermosetting composition. It is preferable that the curable composition is used after proceeding curing by light irradiation and then curing by heating.

A B-staged product is obtained by irradiating the curable composition for inkjet and air cavity formation with light having a wavelength of 365 nm at an illuminance of 2000 mW/cm². The viscosity at 40° C. of the B-staged product is $2.5 \times 10^2$ Pa·s or more and $3.0 \times 10^6$ Pa·s or less. When the viscosity at 40° C. of the B-staged product is less than $2.5 \times 10^2$ Pa·s, it is difficult to form a cured product layer having a high aspect ratio, or it is difficult to enhance sealability. When the viscosity at 40° C. of the B-staged product is more than $3.0 \times 10^6$, it is difficult to enhance adhesiveness, or it is difficult to enhance sealability.

The viscosity at 40° C. of the B-staged product is preferably $3.0 \times 10^3$ Pa·s or more, more preferably $4.0 \times 10^3$ Pa·s or more, even more preferably $5.0 \times 10^3$ Pa·s or more, further preferably $7.5 \times 10^3$ Pa·s or more, particularly preferably $1.0 \times 10^4$ Pa·s or more, and most preferably $2.0 \times 10^4$ Pa·s or more. The viscosity at 40° C. of the B-staged product is preferably $1.0 \times 10^6$ Pa·s or less, more preferably $3.0 \times 10^5$ Pa·s or less, and further preferably $1.0 \times 10^5$ Pa·s or less. When the viscosity at 40° C. of the B-staged product is the lower limit or more, a cured product layer having a high aspect ratio can be even more favorably formed, and sealability can be further enhanced. When the viscosity at 40° C. of the B-staged product is the upper limit or less, adhesiveness and sealability can be further enhanced. The viscosity at 40° C. of the B-staged product may be $7.5 \times 10^3$ Pa·s or less or may be $6.5 \times 10^3$ Pa·s or less.

More specifically, the B-staged product for measuring the viscosity at 40° C. is obtained by irradiating the curable composition for inkjet and air cavity formation with light having a cumulative light quantity of 20000 mJ/cm² so that illuminance at a wavelength of 365 nm is 2000 mW/cm².

The viscosity at 40° C. of the B-staged product is measured using a viscoelasticity measuring device (for example, "Viscoelasticity Measuring Device ARES" manufactured by TA Instruments) under the conditions of 40° C., a measurement plate: a parallel plate having a diameter of 8 mm, and a frequency of 1 Hz. In the present specification, the viscosity of the B-staged product means a complex viscosity ($\eta^*$).

Examples of the method for adjusting the viscosity at 40° C. of the B-staged product within a preferable range include a method of appropriately selecting the type of the (A) photocurable compound, and a method of adjusting the contents of a first photocurable compound described below and a second photocurable compound described below. In particular, from the viewpoint of setting the viscosity at 40° C. of the B-staged product to the lower limit or more, it is preferable to increase the content of the second photocurable compound.

Hereinafter, details of each component contained in the curable composition will be described. In the present specification, "(meth)acryloyl" means one or both of "acryloyl" and "methacryloyl", and "(meth)acrylate" means one or both of "acrylate" and "methacrylate". In the present specification, a $CH_2=CH$ group of the (meth)acryloyl group is not included in the vinyl group.

<(A) Photocurable Compound>

The curable composition contains the (A) photocurable compound. The (A) photocurable compound is a photocurable compound having a (meth)acryloyl group or a vinyl group and having no cyclic ether group. The (A) photocurable compound may have a (meth)acryloyl group, may have a vinyl group, or may have both of a (meth)acryloyl group and a vinyl group. The (meth)acryloyl group and the vinyl group are photocurable functional groups. The (A) photocurable compound does not have, for example, an epoxy group (cyclic ether group). Only one kind of the (A) photocurable compound may be used, or two or more kinds thereof may be used in combination.

From the viewpoint of more effectively exhibiting the effect of the present invention, the (A) photocurable compound preferably includes a first photocurable compound having one, in total, of a (meth)acryloyl group and a vinyl group and preferably includes a second photocurable compound having two or more, in total, of a (meth)acryloyl group and a vinyl group. The first photocurable compound has one (meth)acryloyl group and does not have a vinyl group, or does not have a (meth)acryloyl group and has one vinyl group. The second photocurable compound may have two, three, or three or more, in total, of a (meth)acryloyl group and a vinyl group.

From the viewpoint of more effectively exhibiting the effect of the present invention, the (A) photocurable compound more preferably includes a first photocurable compound having one, in total, of a (meth)acryloyl group and a vinyl group and a second photocurable compound having two or more, in total, of a (meth)acryloyl group and a vinyl group. Only one kind of each of the first photocurable compound and the second photocurable compound may be used, or two or more kinds thereof may be used in combination.

From the viewpoint of more effectively exhibiting the effect of the present invention and the viewpoint of forming the curable composition layer with high accuracy, the (A) photocurable compound preferably has a (meth)acryloyl group. The (A) photocurable compound is preferably a (meth)acrylate compound. From the viewpoint of more effectively exhibiting the effect of the present invention and the viewpoint of forming the curable composition layer with high accuracy, the first photocurable compound is preferably a photocurable compound having one (meth)acryloyl group, and the second photocurable compound is preferably a photocurable compound having two or more (meth)acryloyl groups. That is, the first photocurable compound is preferably a monofunctional (meth)acrylate compound, and the second photocurable compound is preferably a polyfunctional (meth)acrylate compound.

Examples of the monofunctional (meth)acrylate compound as the first photocurable compound include methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth) acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, allyl (meth)acrylate, benzyl (meth)acrylate, cyclohexyl (meth)acrylate, phenyl (meth) acrylate, 2-methoxyethyl (meth)acrylate, 2-phenoxyethyl (meth)acrylate, methoxydiethylene glycol (meth)acrylate, methoxytriethylene glycol (meth)acrylate, methoxypropylene glycol (meth)acrylate, methoxydipropylene glycol (meth)acrylate, isodecyl (meth)acrylate, isononyl (meth) acrylate, isobornyl (meth)acrylate, dicyclopentadienyl (meth)acrylate, 2-hydroxy-3-phenoxypropyl (meth)acrylate, glycerol mono(meth)acrylate, 2-ethylhexyl (meth)acrylate, dihydroxycyclopentadienyl (meth)acrylate, dicyclopentenyl (meth)acrylate, dicyclopentenyloxyethyl (meth)acrylate, dicyclopentanyl (meth)acrylate, naphthyl (meth)acrylate, lauryl (meth)acrylate, dodecyl (meth)acrylate, and stearyl (meth)acrylate.

The second photocurable compound may be a bifunctional (meth)acrylate compound or may be a trifunctional (meth)acrylate compound. The second photocurable compound may be trifunctional or higher (meth)acrylate compound or may be tetrafunctional or higher (meth)acrylate compound. The second photocurable compound may be a (meth)acrylate compound having two (meth)acryloyl groups or may be a (meth)acrylate compound having three (meth)acryloyl groups. The second photocurable compound may be a (meth)acrylate compound having three or more (meth)acryloyl groups or may be a (meth)acrylate compound having four or more (meth)acryloyl groups. The second photocurable compound may be a (meth)acrylate compound having ten or less (meth)acryloyl groups.

Examples of the bifunctional (meth)acrylate compound include 1,4-butanediol di(meth)acrylate, 1,6-hexanediol di(meth)acrylate, 1,9-nonane di(meth)acrylate, 1,10-decanediol di(meth)acrylate, neopentyl glycol di(meth)acrylate, 2,4-dimethyl-1,5-pentanediol di(meth)acrylate, butylethylpropanediol (meth)acrylate, ethoxylated cyclohexane methanol di(meth)acrylate, ethoxylated bisphenol di(meth)acrylate, polyethylene glycol di(meth)acrylate, oligoethylene glycol di(meth)acrylate, ethylene glycol di(meth)acrylate, 2-ethyl-2-butylethanediol di(meth)acrylate, 2-ethyl-2-butylpropanediol di(meth)acrylate, tricyclodecane di(meth)acrylate, tricyclodecane dimethanol di(meth)acrylate, urethane (meth)acrylate, and dipropylene glycol di(meth)acrylate.

Examples of the trifunctional (meth)acrylate compound include trimethylolpropane tri (meth)acrylate, trimethylolethane tri (meth)acrylate, alkylene oxide-modified tri(meth)acrylate of trimethylolpropane, pentaerythritol tri (meth)acrylate, dipentaerythritol tri(meth)acrylate, trimethylolpropane tri((meth)acryloyloxy propyl)ether, isocyanuric acid alkylene oxide-modified tri(meth)acrylate, propionic acid dipentaerythritol tri(meth)acrylate, tri((meth)acryloyloxyethyl)isocyanurate, and sorbitol tri(meth)acrylate.

Examples of the tetrafunctional (meth)acrylate compound include pentaerythritol tetra(meth)acrylate, sorbitol tetra(meth)acrylate, ditrimethylolpropane tetra(meth)acrylate, and propionic acid dipentaerythritol tetra(meth)acrylate.

Examples of the pentafunctional (meth)acrylate compound include sorbitol penta(meth)acrylate and dipentaerythritol penta(meth)acrylate.

Examples of the hexafunctional (meth)acrylate compound include dipentaerythritol hexa(meth)acrylate, sorbitol hexa(meth)acrylate, and alkylene oxide-modified hexa(meth)acrylate of phosphazene.

Examples of the (A) photocurable compound having a vinyl group include vinyl ethers, ethylene derivatives, styrene, chloromethylstyrene, α-methylstyrene, maleic acid anhydride, dicyclopentadiene, N-vinylpyrrolidone, and N-vinylformamide.

The content of the (A) photocurable compound in 100 wt % of the curable composition is preferably 2 wt % or more, more preferably 5 wt % or more, further preferably 10 wt % or more, and particularly preferably 15 wt % or more. The content of the (A) photocurable compound in 100 wt % of the curable composition is preferably 80 wt % or less, more preferably 70 wt % or less, even more preferably 65 wt % or less, further preferably 60 wt % or less, still further preferably 50 wt % or less, and particularly preferably 40 wt % or less. When the content of the (A) photocurable compound is the lower limit or more and the upper limit or less, the effect of the present invention can be more effectively exhibited.

The content of the first photocurable compound in 100 wt % of the curable composition is preferably 2 wt % or more, more preferably 5 wt % or more, and further preferably 10 wt % or more, and is preferably 55 wt % or less, more preferably 45 wt % or less, and further preferably 35 wt % or less. When the content of the first photocurable compound is the lower limit or more and the upper limit or less, the effect of the present invention can be more effectively exhibited.

When the curable composition does not contain the (C) photocurable and thermosetting compound, the content of the first photocurable compound in 100 wt % of the curable composition is preferably 5 wt % or more, more preferably 10 wt % or more, and further preferably 20 wt % or more, and is preferably 55 wt % or less, more preferably 45 wt % or less, and further preferably 35 wt % or less. When the content of the first photocurable compound is the lower limit or more and the upper limit or less, the effect of the present invention can be more effectively exhibited.

When the curable composition contains the (C) photocurable and thermosetting compound, the content of the first photocurable compound in 100 wt % of the curable composition is preferably 2 wt % or more, more preferably 5 wt % or more, and further preferably 10 wt % or more, is preferably 65 wt % or less, more preferably 60 wt % or less, and further preferably 55 wt % or less. When the content of the first photocurable compound is the lower limit or more and the upper limit or less, the effect of the present invention can be more effectively exhibited.

The content of the second photocurable compound in 100 wt % of the curable composition is preferably 1 wt % or more, more preferably 2 wt % or more, and further preferably 3 wt % or more, and is preferably 25 wt % or less, more preferably 15 wt % or less, and further preferably 10 wt % or less. When the content of the second photocurable compound is the lower limit or more and the upper limit or less, the effect of the present invention can be more effectively exhibited.

When the curable composition does not contain the (C) photocurable and thermosetting compound, the content of the second photocurable compound in 100 wt % of the curable composition is preferably 5 wt % or more, more preferably 6 wt % or more, and further preferably 7 wt % or more, and is preferably 25 wt % or less, more preferably 20 wt % or less, and further preferably 15 wt % or less. When the content of the second photocurable compound is the lower limit or more and the upper limit or less, the effect of the present invention can be more effectively exhibited.

When the curable composition contains the (C) photocurable and thermosetting compound, the content of the second photocurable compound in 100 wt % of the curable composition is preferably 4 wt % or more, more preferably 5 wt % or more, and further preferably 6 wt % or more, is preferably 20 wt % or less, more preferably 18 wt % or less, and further preferably 16 wt % or less. When the content of the second photocurable compound is the lower limit or more and the upper limit or less, the effect of the present invention can be more effectively exhibited.

The total content of the first photocurable compound and the second photocurable compound in 100 wt % of the curable composition is preferably 5 wt % or more, more preferably 10 wt % or more, and further preferably 15 wt % or more, and is preferably 80 wt % or less, more preferably 70 wt % or less, and further preferably 60 wt % or less. When the total content is the lower limit or more and the upper limit or less, the effect of the present invention can be more effectively exhibited.

When the curable composition does not contain the (C) photocurable and thermosetting compound, the total content of the first photocurable compound and the second photocurable compound in 100 wt % of the curable composition is preferably 10 wt % or more, more preferably 15 wt % or more, and further preferably 20 wt % or more. When the curable composition does not contain the (C) photocurable and thermosetting compound, the total content of the first photocurable compound and the second photocurable compound in 100 wt % of the curable composition is preferably 80 wt % or less, more preferably 70 wt % or less, and further preferably 60 wt % or less. When the total content is the lower limit or more and the upper limit or less, the effect of the present invention can be more effectively exhibited.

When the curable composition contains the (C) photocurable and thermosetting compound, the total content of the first photocurable compound and the second photocurable compound in 100 wt % of the curable composition is preferably 5 wt % or more, more preferably 10 wt % or more, and further preferably 15 wt % or more. When the curable composition contains the (C) photocurable and thermosetting compound, the total content of the first photocurable compound and the second photocurable compound in 100 wt % of the curable composition is preferably 80 wt % or less, more preferably 70 wt % or less, and further preferably 60 wt % or less. When the total content is the lower limit or more and the upper limit or less, the effect of the present invention can be more effectively exhibited.

The content of the first photocurable compound in 100 wt % of the (A) photocurable compound is preferably 25 wt % or more, more preferably 30 wt % or more, and further preferably 35 wt % or more, and is preferably 90 wt % or less, more preferably 80 wt % or less, and further preferably 75 wt % or less. When the content of the first photocurable compound is the lower limit or more and the upper limit or less, the effect of the present invention can be more effectively exhibited.

The content of the second photocurable compound in 100 wt % of the (A) photocurable compound is preferably 5 wt % or more, more preferably 10 wt % or more, and further preferably 15 wt % or more, and is preferably 60 wt % or less, more preferably 55 wt % or less, and further preferably 50 wt % or less. When the content of the second photocurable compound is the lower limit or more and the upper limit or less, the effect of the present invention can be more effectively exhibited.

When the curable composition does not contain the (C) photocurable and thermosetting compound, the content of the second photocurable compound in 100 wt % of the (A) photocurable compound is preferably 5 wt % or more and more preferably 10 wt % or more, and is preferably 25 wt % or less and more preferably 20 wt % or less. When the content of the second photocurable compound is the lower limit or more and the upper limit or less, the effect of the present invention can be more effectively exhibited.

When the curable composition contains the (C) photocurable and thermosetting compound, the content of the second photocurable compound in 100 wt % of the total content of the (A) photocurable compound and the (C) photocurable and thermosetting compound is preferably 4 wt % or more and more preferably 10 wt % or more, and is preferably 20 wt % or less and more preferably 15 wt % or less. When the content of the second photocurable compound is the lower limit or more and the upper limit or less, the effect of the present invention can be more effectively exhibited.

<(B) Thermosetting Compound>

The curable composition contains the (B) thermosetting compound. The (B) thermosetting compound is a thermosetting compound having no (meth)acryloyl group and having a cyclic ether group. The cyclic ether group is a thermosetting functional group. Only one kind of the (B) thermosetting compound may be used, or two or more kinds thereof may be used in combination.

Examples of the cyclic ether group of the (B) thermosetting compound include an epoxy group. The (B) thermosetting compound may have only one cyclic ether group or may have two or more cyclic ether groups.

From the viewpoint of more effectively exhibiting the effect of the present invention and the viewpoint of forming the curable composition layer with high accuracy, the cyclic ether group of the (B) thermosetting compound is preferably an epoxy group. The (B) thermosetting compound preferably has an epoxy group. The (B) thermosetting compound is preferably an epoxy compound.

The (B) thermosetting compound may include a first thermosetting compound having one cyclic ether group, or may include a second thermosetting compound having two or more cyclic ether groups. The (B) thermosetting compound may include an epoxy compound having one epoxy group (monofunctional epoxy compound), or may include an epoxy compound having two or more epoxy groups (polyfunctional epoxy compound). Only one kind of each of the first thermosetting compound and the second thermosetting compound may be used, or two or more kinds thereof may be used in combination.

From the viewpoint of more effectively exhibiting the effect of the present invention, the (B) thermosetting compound preferably includes an epoxy compound having two or more epoxy groups and is more preferably an epoxy compound having two or more epoxy groups.

From the viewpoint of more effectively exhibiting the effect of the present invention, the (B) thermosetting compound preferably includes an epoxy compound having two epoxy groups and is more preferably an epoxy compound having two epoxy groups.

Examples of the epoxy compound include a bisphenol A type epoxy compound, a bisphenol F type epoxy compound, a bisphenol S type epoxy compound, a phenol novolac type epoxy compound, a biphenyl type epoxy compound, a biphenyl novolac type epoxy compound, a biphenol type epoxy compound, a naphthalene type epoxy compound, a fluorene type epoxy compound, a phenol aralkyl type epoxy compound, a naphthol aralkyl type epoxy compound, a dicyclopentadiene type epoxy compound, an anthracene type epoxy compound, an epoxy compound having an adamantane skeleton, an epoxy compound having a tricyclodecane skeleton, a naphthylene ether type epoxy compound, and an epoxy compound having a triazine nucleus in the skeleton.

From the viewpoint of exhibiting the effect of the present invention, particularly from the viewpoint of enhancing the adhesive strength between the member to be bonded and the cured product (bonding portion) of the curable composition, the content of the (B) thermosetting compound in 100 wt % of the curable composition is 5 wt % or more.

The content of the (B) thermosetting compound in 100 wt % of the curable composition is preferably 10 wt % or more, more preferably 15 wt % or more, and further preferably 20 wt % or more, and is preferably 50 wt % or less, more preferably 40 wt % or less, and further preferably 35 wt % or less. When the content of the (B) thermosetting compound is the lower limit or more and the upper limit or less, the effect of the present invention can be more effectively exhibited, and the adhesive strength between the member to be bonded and the cured product (bonding portion) of the curable composition can be further enhanced.

The total content of the (A) photocurable compound and the (B) thermosetting compound in 100 wt % of the curable composition is preferably 7 wt % or more, more preferably 12 wt % or more, further preferably 17 wt % or more, particularly preferably 20 wt % or more, and most preferably 30 wt % or more. The total content of the (A) photocurable compound and the (B) thermosetting compound in 100 wt % of the curable composition is preferably 75 wt % or less, more preferably 70 wt % or less, and further preferably 65 wt % or less. When the total content is the lower limit or more and the upper limit or less, the effect of the present invention can be more effectively exhibited.

<(C) Photocurable and Thermosetting Compound>

The curable composition may or may not contain the (C) photocurable and thermosetting compound. The (C) photocurable and thermosetting compound is a photocurable and thermosetting compound having a (meth)acryloyl group and having a cyclic ether group. From the viewpoint of further enhancing the adhesive strength between the member to be bonded and the cured product (bonding portion) of the curable composition, the curable composition preferably contains the (C) photocurable and thermosetting compound. The (meth)acryloyl group is a photocurable functional group, and the cyclic ether group is a thermosetting functional group. Only one kind of the (C) photocurable and thermosetting compound may be used, or two or more kinds thereof may be used in combination.

The (C) photocurable and thermosetting compound may have one (meth)acryloyl group or may have two or more (meth)acryloyl groups.

Examples of the cyclic ether group of the (C) photocurable and thermosetting compound include an epoxy group. The (C) photocurable and thermosetting compound may have only one cyclic ether group or may have two or more cyclic ether groups.

From the viewpoint of more effectively exhibiting the effect of the present invention and the viewpoint of further enhancing the adhesive strength between the member to be bonded and the cured product (bonding portion) of the curable composition, the cyclic ether group of the (C) photocurable and thermosetting compound is preferably an epoxy group. The (C) photocurable and thermosetting compound preferably has a (meth)acryloyl group and an epoxy group.

The (C) photocurable and thermosetting compound may have one cyclic ether group, may have two cyclic ether groups, or may have two or more cyclic ether groups. The (C) photocurable and thermosetting compound may have one epoxy group, may have two epoxy groups, or may have two or more epoxy groups.

Examples of the (C) photocurable and thermosetting compound include glycidyl (meth)acrylate and 4-hydroxybutyl (meth)acrylate glycidyl ether.

The (C) photocurable and thermosetting compound preferably includes glycidyl (meth)acrylate or 4-hydroxybutyl (meth)acrylate glycidyl ether, and more preferably includes 4-hydroxybutyl (meth)acrylate glycidyl ether. The (C) photocurable and thermosetting compound further preferably includes 4-hydroxybutyl acrylate glycidyl ether. In this case, the effect of the present invention can be more effectively exhibited, and the adhesive strength between the member to be bonded and the cured product (bonding portion) of the curable composition can be further enhanced.

The content of the (C) photocurable and thermosetting compound in 100 wt % of the curable composition is preferably 5 wt % or more and more preferably 10 wt % or more, and is preferably 70 wt % or less, more preferably 65 wt % or less, and further preferably 60 wt % or less. When the content of the (C) photocurable and thermosetting compound is the lower limit or more and the upper limit or less, the effect of the present invention can be more effectively exhibited, and the adhesive strength between the member to be bonded and the cured product (bonding portion) of the curable composition can be further enhanced.

The total content of the (A) photocurable compound and the (C) photocurable and thermosetting compound in 100 wt % of the curable composition is preferably 15 wt % or more, more preferably 20 wt % or more, and further preferably 30 wt % or more, and is preferably 75 wt % or less, more preferably 70 wt % or less, and further preferably 65 wt % or less. When the total content is the lower limit or more and the upper limit or less, the effect of the present invention can be more effectively exhibited, and the adhesive strength between the member to be bonded and the cured product (bonding portion) of the curable composition can be further enhanced.

The total content of the (B) thermosetting compound and the (C) photocurable and thermosetting compound in 100 wt % of the curable composition is preferably 17 wt % or more, more preferably 20 wt % or more, and further preferably 25 wt % or more, and is preferably 70 wt % or less, more preferably 60 wt % or less, and further preferably 55 wt % or less. When the total content is the lower limit or more and the upper limit or less, the effect of the present invention can be more effectively exhibited, and the adhesive strength between the member to be bonded and the cured product (bonding portion) of the curable composition can be further enhanced.

<Photopolymerization Initiator>

The curable composition preferably contains a photopolymerization initiator. Only one kind of the photopolymerization initiator may be used, or two or more kinds thereof may be used in combination.

Examples of the photopolymerization initiator include a photoradical polymerization initiator and a photocationic polymerization initiator. The photopolymerization initiator is preferably a photoradical polymerization initiator.

The photoradical polymerization initiator is a compound for generating radicals by light irradiation to initiate a radical polymerization reaction. Examples of the photoradical polymerization initiator include benzoin compounds such as benzoin, benzoin methyl ether, benzoin ethyl ether, and benzoin isopropyl ether; alkyl phenone compounds such as 2-hydroxy-2-methyl-1-phenyl-propan-1-one; acetophenone compounds such as acetophenone, 2,2-dimethoxy-2-phenyl acetophenone, 2,2-diethoxy-2-phenyl acetophenone, and 1,1-dichloroacetophenone; aminoacetophenone compounds such as 2-methyl-1-[4-(methylthio)phenyl]-2-morpholino propan-1-one, 2-benzyl-2-dimethylamino-1-(4-morpholinophenyl)-butan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, and N,N-dimethylaminoacetophenone; anthraquinone compounds such as 2-methyl anthraquinone, 2-ethylanthraquinone, and 2-t-butylanthraquinone; thioxanthone compounds such as 2,4-dimethyl thioxanthone, 2,4-diethyl thioxanthone, 2-chlorothioxanthone, and 2,4-diisopropylthioxanthone; ketal compounds such as acetophenone dimethyl ketal and benzyl dimethyl ketal; acylphosphine oxide compounds such as 2,4,6-trimethylbenzoyldiphenylphosphine oxide and bis(2,4,6-trimethylbenzoyl)-phenylphosphine oxide; oxime ester compounds such as 1,2-octanedione, 1-[4-(phenyl-thio)-2-(o-benzoyl oxime)], ethanone, and 1-[9-ethyl-6-(2-methyl benzoyl)-9H-carbazole-3-yl]-1-(o-acetyloxime); and titanocene compounds such as bis(cyclopentadienyl)-di-phenyl-titanium, bis(cyclopentadienyl)-di-chloro-titanium, bis(cyclopentadienyl)-bis(2,3,4,5,6-pentafluorophenyl) tita-nium, and bis(cyclopentadienyl)-bis(2,6-difluoro-3-(pyrrol-1-yl)phenyl) titanium. Only one kind of the photoradical polymerization initiator may be used, or two or more kinds thereof may be used in combination.

A photopolymerization initiation aid may be used together with the photoradical polymerization initiator. Examples of the photopolymerization initiation aid include N,N-dimethylaminobenzoic acid ethyl ester, N,N-dimethyl-aminobenzoic acid isoamyl ester, pentyl-4-dimethylamino-benzoate, triethylamine, and triethanolamine. A photopoly-merization initiation aid other than these compounds may also be used. Only one kind of the photopolymerization initiation aid may be used, or two or more kinds thereof may be used in combination.

A titanocene compound, such as CGI-784 (manufactured by Ciba Specialty Chemicals), having absorption in a visible light region may be used to promote the photoreaction.

Examples of the photocationic polymerization initiator include sulfonium salts, iodonium salts, metallocene com-pounds, and benzoin tosylate. Only one kind of the photo-cationic polymerization initiator may be used, or two or more kinds thereof may be used in combination.

The content of the photopolymerization initiator in 100 wt % of the curable composition is preferably 0.1 wt % or more, more preferably 0.5 wt % or more, and further preferably 1 wt % or more, and is preferably 30 wt % or less, more preferably 20 wt % or less, and further preferably 10 wt % or less.

<Thermal Curing Agent>

The curable composition preferably contains a thermal curing agent. Only one kind of the thermal curing agent may be used, or two or more kinds thereof may be used in combination.

Examples of the thermal curing agent include an organic acid, an amine compound, an amide compound, a hydrazide compound, an imidazole compound, an imidazoline com-pound, a phenol compound, a urea compound, a polysulfide compound, and an acid anhydride. As the thermal curing agent, a modified polyamine compound such as an amine-epoxy adduct may be used. A thermal curing agent other than these compounds may also be used.

The amine compound means a compound having one or more primary to tertiary amino groups. Examples of the amine compound include aliphatic polyamines, alicyclic polyamines, aromatic polyamines, hydrazides, and guani-dine derivatives. As the amine compound, adducts, such as an epoxy compound-added polyamine (a reaction product of an epoxy compound and a polyamine), a Michael-added polyamine (a reaction product of α,β-unsaturated ketone and a polyamine), a Mannich-added polyamine (a condensate of a polyamine, formalin, and phenol), a thiourea-added polyamine (a reaction product of thiourea and a polyamine), and a ketone-blocked polyamine (a reaction product of a ketone compound and a polyamine [ketimine]), may be used.

Examples of the aliphatic polyamines include diethylen-etriamine, triethylenetetramine, tetraethylenepentamine, and diethylamino propylamine.

Examples of the alicyclic polyamines include menthene-diamine, isophoronediamine, N-aminoethylpiperazine, 3,9-bis(3-aminopropyl)-2,4,8,10-tetraoxaspiro(5,5)undecane adduct, bis(4-amino-3-methylcyclohexyl)methane, and bis (4-aminocyclohexyl)methane.

Examples of the aromatic polyamines include m-phe-nylenediamine, p-phenylenediamine, o-xylenediamine, m-xylenediamine, p-xylenediamine, 4,4-diaminodiphenyl-methane, 4,4-diaminodiphenylpropane, 4,4-diaminodiphe-nylsulfone, 4,4-diaminodicyclohexane, bis(4-aminophenyl) phenylmethane, 1,5-diaminonaphthalene, 1,1-bis(4-aminophenyl)cyclohexane, 2,2-bis[(4-aminophenoxy) phenyl]propane, bis[4-(4-aminophenoxy)phenyl]sulfone, 1,3-bis(4-aminophenoxy)benzene, 4,4-methylene-bis(2-chloroaniline), and 4,4-diaminodiphenylsulfone.

Examples of the hydrazides include carbodihydrazide, adipic acid dihydrazide, sebacic acid dihydrazide, dodecane-dioic acid dihydrazide, and isophthalic acid dihydrazide.

Examples of the guanidine derivatives include dicyandi-amide, 1-o-tolyldiguanide, α-2,5-dimethylguanide, α,ω-di-phenyldiguanizide, α,α-bisguanyl guanidino diphenyl ether, p-chlorophenyldiguanide, α,α-hexamethylene bis [ω-(p-chlorophenol)]diguanide, phenyldiguanide oxalate, acetylguanidine, and diethylcyanoacetylguanidine.

Examples of the phenol compound include polyhydric phenol compounds. Examples of the polyhydric phenol compounds include phenol, cresol, ethylphenol, butylphe-nol, octylphenol, bisphenol A, tetrabromobisphenol A, bis-phenol F, bisphenol S, 4,4'-biphenylphenol, a naphthalene skeleton-containing phenol novolac resin, a xylylene skel-eton-containing phenol novolac resin, a dicyclopentadiene skeleton-containing phenol novolac resin, and a fluorene skeleton-containing phenol novolac resin.

Examples of the acid anhydride include phthalic anhy-dride, tetrahydrophthalic anhydride, hexahydrophthalic anhydride, methyltetrahydrophthalic anhydride, methyl-nadic anhydride, dodecylsuccinic anhydride, chlorendic anhydride, pyromellitic anhydride, benzophenone tetracar-boxylic anhydride, methylcyclohexene tetracarboxylic anhydride, trimellitic anhydride, and poly(azelaic anhy-dride).

The thermal curing agent is preferably a thermal curing agent other than the acid anhydride. The acid anhydride is a compound relatively easily volatilized. Therefore, by using a thermal curing agent other than the acid anhydride, con-tamination of an electronic component due to volatilization of the thermal curing agent can be suppressed. By using a thermal curing agent other than the acid anhydride, the adhesive strength between the member to be bonded and the cured product (bonding portion) of the curable composition can be further enhanced.

The thermal curing agent preferably includes an amine compound and is preferably an amine compound. The amine compound is preferably an aromatic amine compound. In this case, the adhesive strength between the member to be bonded and the cured product (bonding portion) of the curable composition can be further enhanced.

The content of the thermal curing agent in 100 wt % of the curable composition is preferably 1 wt % or more, more preferably 5 wt % or more, and further preferably 10 wt % or more, and is preferably 40 wt % or less, more preferably 30 wt % or less, and further preferably 25 wt % or less.

<Curing Accelerator>

The curable composition may or may not contain a curing accelerator. Only one kind of the curing accelerator may be used, or two or more kinds thereof may be used in combi-nation.

Examples of the curing accelerator include a tertiary amine, an imidazole, a quaternary ammonium salt, a quaternary phosphonium salt, an organic metal salt, a phosphorus compound, and a urea compound.

The content of the curing accelerator in 100 wt % of the curable composition is preferably 0.01 wt % or more and more preferably 0.05 wt % or more, and is preferably 10 wt % or less and more preferably 5 wt % or less.

<Solvent>

The curable composition may or may not contain a solvent. Only one kind of the solvent may be used, or two or more kinds thereof may be used in combination.

Examples of the solvent include water and an organic solvent.

From the viewpoint of further enhancing removability of residual materials. the solvent is preferably an organic solvent.

Examples of the organic solvent include alcohols such as ethanol, ketones such as acetone, methyl ethyl ketone, and cyclohexanone, aromatic hydrocarbons such as toluene, xylene, and tetramethylbenzene, glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and tripropylene glycol monomethyl ether, esters such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate, and propylene carbonate, aliphatic hydrocarbons such as octane and decane, and petroleum-based solvents such as petroleum ether and naphtha.

From the viewpoint of further enhancing the thickness accuracy of the curable composition layer, the content of the solvent in the curable composition is preferably as small as possible.

When the curable composition contains the solvent, the content of the solvent in 100 wt % of the curable composition is preferably 5 wt % or less, more preferably 1 wt % or less, and further preferably 0.5 wt % or less. It is most preferable that the curable composition does not contain the solvent.

<Other Components>

The curable composition may contain components other than the components described above. The other components are not particularly limited, and examples thereof include adhesion aids such as a coupling agent, a filler, a levelling agent, an antifoaming agent, and polymerization inhibitor polymerization inhibitor.

(Other Details of Curable Composition)

Since the curable composition is applied using an inkjet device, the curable composition is generally liquid at 25° C. The viscosity at 25° C. and 10 rpm of the curable composition is preferably 3 mPa·s or more, more preferably 5 mPa·s or more, even more preferably 10 mPa·s or more, and further preferably 160 mPa·s or more, and is preferably 2000 mPa·s or less, more preferably 1600 mPa·s or less, and further preferably 1500 mPa·s or less. From the viewpoint of further enhancing the thickness accuracy of the curable composition layer and further making voids more hardly generated in the curable composition layer, the viscosity at 25° C. and 10 rpm of the curable composition is particularly preferably 160 mPa·s or more and 1600 mPa·s or less.

The viscosity is measured at 25° C. using an E-type viscometer (for example, "TVE22L" manufactured by Toki Sangyo Co., Ltd.) in accordance with JIS K2283.

It is preferable that the curable composition can form a B-staged product having a ratio of a height to a width (height/width) (aspect ratio) of 1.0 or more, when a B-staged product is obtained by irradiating the curable composition for inkjet and air cavity formation with light having a wavelength of 365 nm at an illuminance of 2000 mW/cm². The curable composition is preferably capable of forming a B-staged product having the ratio (height/width) of 1.5 or more, more preferably capable of forming a B-staged product having the ratio (height/width) of 2.0 or more, and further preferably capable of forming a B-staged product having the ratio (height/width) of 2.5 or more. When the curable composition is capable of forming a B-staged product having the ratio (height/width) of 1.0 or more, a cured product layer having a high ratio (height/width) (aspect ratio) can be formed, and adhesiveness and sealability can be further enhanced. The ratio (height/width) may be 100 or less, 50 or less, 10 or less, or 5.0 or less.

A B-staged product for measuring the ratio (height/width) can be formed by the following method. The curable composition is applied using an inkjet device to form a curable composition layer (application step). Subsequently, the curable composition layer is irradiated with light having a cumulative light quantity of 200 mJ/cm² so that illuminance at a wavelength of 365 nm is 2000 mW/cm², and curing of the curable composition layer is allowed to proceed to form a B-staged product (B-staged product layer) (photocuring step). In the application step and the photocuring step, application and photocuring are repeated in the thickness direction of the curable composition layer to form a B-staged product (B-staged product layer).

In the curable composition according to the present invention, a cured product layer having a large ratio of a height to a width can be formed. The curable composition according to the present invention can be suitably used for forming a cured product layer having a ratio of a height to a width (height/width) (aspect ratio) of 1.0 or more (use of the curable composition for forming a cured product layer having a ratio of a height to a width (height/width) (aspect ratio) of 1.0 or more). The ratio (height/width) of the cured product layer is preferably 1.5 or more, more preferably 2.0 or more, and further preferably 2.5 or more, and may be 100 or less, 50 or less, 10 or less, or 5.0 or less.

The first member and the second member can be bonded to each other using the curable composition, and an air cavity can be formed. An electronic component having an air cavity can be manufactured using the curable composition. The curable composition is preferably a curable composition used for bonding the upper surface of the first member and the side surface or the lower surface of the second member, and more preferably a curable composition used for bonding the upper surface of the first member and the side surface of the second member. In this case, the curable composition may be a curable composition used for bonding the upper surface of the first member and the side surface and the upper surface of the second member.

Details of the first member and the second member will be described below.

(Electronic Component and Method for Manufacturing Electronic Component)

An electronic component according to the present invention includes a first member, a second member, and a bonding portion bonding an upper surface of the first member and a side surface or a lower surface of the second member, and an air cavity is formed by the first member, the second member, and the bonding portion. In the electronic component according to the present invention, the bonding portion is a cured product of the curable composition for inkjet and air cavity formation.

The method for manufacturing the electronic component preferably includes the following steps (1) to (3): (1) an application step of applying curable composition onto a surface of a first member using an inkjet device to form a curable composition layer; (2) a photocuring step of allowing curing of the curable composition layer to proceed by light irradiation to form a B-staged product layer; and (3) a thermal curing step of thermally curing the B-staged product layer by heating.

In the method for manufacturing the electronic component, in the application step and the photocuring step, application and photocuring are repeated in a thickness direction of the curable composition layer to form a B-staged product layer in contact with a side surface or a lower surface of a second member.

Hereinafter, specific embodiments of the present invention will be described with reference to the drawings. In the following drawings, the size, thickness, shape, and the like may be different from the actual size, thickness, shape, and the like for convenience of illustration.

FIG. 1 is a cross-sectional view schematically illustrating an electronic component obtained using a curable composition for inkjet and air cavity formation according to a first embodiment of the present invention.

An electronic component 10 illustrated in FIG. 1 includes a first member 1, a second member 2, a bonding portion 3, a solder ball 41, a resin sheet 42, a connection terminal 43, and a mold resin portion 44. The bonding portion 3 is a cured product of the curable composition. The bonding portion 3 is a photocured and thermoset product of the curable composition. The bonding portion 3 bonds an upper surface of the first member 1 and a side surface and an upper surface of the second member 2. The bonding portion 3 is disposed on the upper surface of the first member 1. The bonding portion 3 is disposed on the side surface of the second member 2 and is disposed on the upper surface of the second member 2. The bonding portion 3 is disposed on a part of the upper surface of the first member 1 and is disposed on a part of the side surface and the entire upper surface of the second member 2. The bonding portion 3 is not disposed on the lower surface of the second member 2. An air cavity R is formed by the first member 1, the second member 2, and the bonding portion 3. The mold resin portion 44 is disposed on an outer surface of the bonding portion 3.

In the electronic component 10, the first member 1 is a circuit board, and the second member 2 is a semiconductor chip. The electronic component 10 is a communication filter.

In the electronic component, the bonding portion may or may not be disposed on the upper surface of the second member. In the electronic component, the bonding portion may or may not be disposed on the lower surface of the second member. In the electronic component, the bonding portion may be disposed on the lower surface of the second member and may not be disposed on the side surface.

An example of a method for manufacturing the electronic component illustrated in FIG. 1 will be described with reference to FIGS. 2(a) to 2(c) and FIGS. 3(d) to 3(g).

First, as illustrated in FIG. 2(a), the curable composition is applied onto a surface of the first member 1 using an inkjet device to form a curable composition layer 3A (application step). The curable composition is applied to the upper surface of the first member 1 to form the curable composition layer 3A. The curable composition is ejected from an ejection portion 51 of the inkjet device.

Next, as illustrated in FIG. 2(b), the curable composition layer 3A is irradiated with light from a light irradiation unit 52 of the inkjet device, and curing of the curable composition layer 3A is allowed to proceed to form a B-staged product layer 3B (photocuring step). The B-staged product layer 3B is a preliminary-cured product layer of the curable composition.

In the method for manufacturing the electronic component, after the curable composition is applied to a specific region, the entire applied curable composition may be irradiated with light to form a B-staged product layer. In the method for manufacturing the electronic component, every time a plurality of drops of the curable composition is applied, the applied curable composition may be irradiated with light to form a B-staged product layer. In the method for manufacturing the electronic component, every time one drop of the curable composition is applied, the applied curable composition may be irradiated with light to form a B-staged product layer.

After the photocuring step, it is determined whether or not the application step and the photocuring step are repeated. When the application step and the photocuring step are repeated, the curable composition is applied to the surface of the formed B-staged product layer on a side opposite to the first member.

FIGS. 2(c) and 3(d) are views illustrating a second application step and a second photocuring step, respectively. As illustrated in FIG. 2(c), the curable composition is applied onto a surface of the B-staged product layer 3B on a side opposite to the first member 1 using the inkjet device to form the curable composition layer 3A on the surface of the B-staged product layer 3B. Next, as illustrated in FIG. 3(d), the applied curable composition layer 3A is irradiated with light from the light irradiation unit 52 of the inkjet device to form the B-staged product layer 3B.

In FIGS. 2 and 3, the application step and the photocuring step are performed twice in FIGS. 2(a) and 2(b) and FIGS. 2(c) and 3(d) in the thickness direction of the curable composition layer. By performing each of the application step and the photocuring step a plurality of times in the thickness direction of the curable composition layer, the thickness of the B-staged product layer can be increased, and the ratio (height (thickness)/width) (aspect ratio) of the B-staged product layer can be increased. Each of the application step and the photocuring step may be performed two or more times or three or more times.

In the application step and the photocuring step, application and photocuring are repeated to form the B-staged product layer 3B in contact with the side surface of the second member 2 as illustrated in FIG. 3(e). In FIG. 3(e), the B-staged product layer 3B in contact with the side surface and the upper surface of the second member 2.

Next, the B-staged product layer 3B is thermally cured by heating (thermal curing step). The B-staged product layer 3B is thermally cured by heating a laminated structure including the first member 1, the second member 2, and the B-staged product layer 3B obtained in FIG. 3(e). As a result, as illustrated in FIG. 3(f), the bonding portion 3 is formed. The bonding portion 3 is a photocured and thermoset product layer of the curable composition.

Next, as illustrated in FIG. 3(g), a resin is disposed outside the bonding portion 3 to form the mold resin portion 44.

In this way, the electronic component 10 illustrated in FIG. 1 can be obtained.

In the photocuring step, ultraviolet rays are preferably irradiated. The illuminance and irradiation time of the ultraviolet rays in the photocuring step can be appropriately changed depending on the composition of the curable composition and the application thickness of the curable composition. The illuminance of the ultraviolet rays in the photocuring step may be, for example, 1000 mW/cm$^2$ or more or 5000 mW/cm$^2$ or more, and may be 10000 mW/cm$^2$ or less or 8000 mW/cm$^2$ or less. The irradiation time of the ultraviolet rays in the photocuring step may be, for example, 0.01 seconds or longer or 0.1 seconds or longer, and may be 400 seconds or shorter or 100 seconds or shorter.

The heating temperature and the heating time in the thermal curing step can be appropriately changed depending on the composition of the curable composition and the thickness of the B-staged product layer. The heating temperature in the thermal curing step may be, for example, 100° C. or higher or 120° C. or higher, and may be 250° C. or lower or 200° C. or lower. The heating time in the thermal curing step may be, for example, 5 minutes or longer or 30 minutes or longer, and may be 600 minutes or shorter or 300 minutes or shorter.

A ratio of the height of the bonding portion to the width of the bonding portion (height/width) is preferably 1.0 or more, more preferably 1.5 or more, further preferably 2.0 or more, and particularly preferably 2.5 or more. When the ratio (height/width) is the lower limit or more, adhesiveness and sealability can be further enhanced. The upper limit of the ratio (height/width) is not particularly limited. The ratio (height/width) of the bonding portion may be 100 or less, 50 or less, 10 or less, or 5.0 or less. From the viewpoint of downsizing an electronic component to be obtained, the ratio (height/width) is preferably 5.0 or less.

The width, height, shape, and the like of the bonding portion can be appropriately changed.

The width of the bonding portion is preferably the width of the bonding portion on a contact surface between the surface of the first member and the bonding portion. In the contact surface between the surface of the first member and the bonding portion, the width of the bonding portion may be 50 μm or more, 100 μm or more, or 150 μm or more, and may be 250 μm or less, 230 μm or less, or 200 μm or less.

The height of the bonding portion is preferably a distance from the contact surface between the surface of the first member and the bonding portion to a maximum height position of the bonding portion. The distance from the contact surface between the surface of the first member and the bonding portion to the maximum height position of the bonding portion may be 100 μm or more, 200 μm or more, or 300 μm or more, and may be 500 μm or less, 450 μm or less, or 400 μm or less.

Examples of the first member include a circuit board.

Examples of the second member include a semiconductor chip.

Hereinafter, the present invention will be described in more detail with reference to Examples. The present invention is not limited only to the following Examples.

The following materials were prepared.

((A) Photocurable Compound)

Monofunctional (meth)acrylate compound 1: 2-ethylhexyl acrylate ("AEH" manufactured by NIPPON SHOKUBAI CO., LTD.)

Monofunctional (meth)acrylate compound 2: isobornyl acrylate ("IBOA" manufactured by NIPPON SHOKUBAI CO., LTD.)

Bifunctional (meth)acrylate compound 1: ethoxylated bisphenol diacrylate A ("ABE-300" manufactured by SHIN-NAKAMURA CHEMICAL Co., Ltd.)

Bifunctional (meth)acrylate compound 2: tricyclodecane dimethanol diacrylate ("IRR-214K" manufactured by DAICEL-ALLNEX LTD.)

Bifunctional (meth)acrylate compound 3: polyester-based urethane acrylate ("UA4400" manufactured by SHIN-NAKAMURA CHEMICAL Co., Ltd.)

Trifunctional (meth)acrylate compound: trimethylolpropane triacrylate ("TMPTA" manufactured by DAICEL-ALLNEX LTD.)

Hexafunctional (meth)acrylate compound: dipentaerythritol hexaacrylate ("DPHA" manufactured by DAICEL-ALLNEX LTD.)

((B) Thermosetting Compound)

Bifunctional epoxy compound 1: bisphenol A type epoxy compound ("YD127" manufactured by Nippon Steel & Sumikin Chemical Co., Ltd.)

Bifunctional epoxy compound 2: glycidyl amine type epoxy compound ("JER630" manufactured by Mitsubishi Chemical Corporation)

Bifunctional epoxy compound 3: bisphenol F type epoxy compound ("YDF-170" manufactured by Nippon Steel & Sumikin Chemical Co., Ltd.)

Bifunctional epoxy compound 4: dicyclopentadienedimethanol diglycidyl ether ("EP-4088S" manufactured by ADEKA Corporation)

((C) Photocurable and Thermosetting Compound)

4-hydroxybutyl acrylate glycidyl ether ("4HBAGE" manufactured by Nippon Kasei Chemical Co., Ltd.)

(Photopolymerization Initiator)

Photopolymerization initiator 1: 2-(dimethylamino)-2-(4-methylbenzyl)-1-(4-morpholinophenyl)butan-1-one ("Irgacure 379" manufactured by BASF SE)

Photopolymerization initiator 2: 2-(dimethylamino)-1-(4-morpholinophenyl)-2-benzyl-1-butanone ("Irgacure 369" manufactured by BASF SE)

(Thermal Curing Agent)

Thermal curing agent 1: 1,3-bis(3-aminophenoxy)benzene ("APBN" manufactured by Mitsui Chemicals, Inc.)

Thermal curing agent 2: 4,4'-diaminodiphenyl ether ("4, 4'-DADPE" manufactured by Mitsui Chemicals, Inc.)

(Coupling Agent)

3-Methacryloxypropyltrimethoxysilane ("KBM503" manufactured by Shin-Etsu Chemical Co., Ltd.)

EXAMPLES 1 TO 22 AND COMPARATIVE EXAMPLES 1 TO 5

The components shown in Tables 1 to 5 were blended in the blending amounts shown in Tables 1 to 5 and mixed uniformly to obtain a curable composition for inkjet and air cavity formation (curable composition).

(Evaluation)

(1) Viscosity at 40° C. of B-Staged Product

The obtained curable composition was irradiated with light for 10 seconds using an exposure apparatus (ultra-high pressure mercury lamp, "JL-4300-3" manufactured by ORC MANUFACTURING CO., LTD.) adjusted so that the illuminance at a wavelength of 365 nm measured by an illuminometer ("UIT-201" manufactured by Ushio Inc.) was 2000 mW/cm$^2$ (cumulative light quantity: 20000 mJ/cm$^2$). The viscosity at 40° C. of the obtained B-staged product was measured using a viscoelasticity measuring device ("Viscoelasticity Measuring Device ARES" manufactured by TA Instruments) under the conditions of 40° C., a measurement plate: a parallel plate having a diameter of 8 mm, and a frequency of 1 Hz.

(2) Formability of Cured Product Layer Having High Aspect Ratio

A semiconductor wafer (thickness: 0.7 mm) was prepared. The obtained curable composition was applied onto a surface of this semiconductor wafer using an inkjet device to form a curable composition layer (application step). Subsequently, the curable composition layer was irradiated with light, and curing of the curable composition layer was allowed to proceed to form a B-staged product layer (photocuring step). Light irradiation in the photocuring step was performed under the condition of 2000 mW/cm$^2$×0.1 seconds (cumulative light quantity: 200 mJ/cm$^2$) using a UV-LED lamp having a main wavelength of 365 nm. In the application step and the photocuring step, application and photocuring were repeated in the thickness direction of the curable composition layer to form a B-staged product layer. The obtained B-staged product layer was observed with a laser microscope ("OLS4000" manufactured by Olympus Corporation) at a magnification of 20 times, and the ratio (height/width) (aspect ratio) of the B-staged product layer was obtained. The formability of the cured product layer having a high aspect ratio was evaluated according to the following criteria. The width of the formed B-staged product layer was 100 μm. Therefore, for example, the B-staged product layer having an aspect ratio of 2.5 means a B-staged product layer having a height of 250 μm and a width of 100 μm.

<Determination Criteria for Formability of Cured Product Layer Having High Aspect Ratio>

OO: A B-staged product layer having an aspect ratio of 2.5 or more can be formed.

O: A B-staged product layer having an aspect ratio of 2.0 or more and less than 2.5 can be formed.

Δ: A B-staged product layer having an aspect ratio of 1.0 or more and less than 2.0 can be formed.

X: A B-staged product layer having an aspect ratio of less than 1.0 can be formed.

(3) Adhesiveness (Die Shear Strength at 260° C.)

The obtained curable composition was applied on a surface of a silicon wafer using a spin coater to form a curable composition layer having a thickness of 20 μm. The curable composition layer was irradiated with light for 10 seconds using an exposure apparatus (ultra-high pressure mercury lamp, "JL-4300-3" manufactured by ORC MANU-FACTURING CO., LTD.) adjusted so that the illuminance at 365 nm measured at 25° C. by an illuminometer ("UIT-201" manufactured by Ushio Inc.) was 2000 mW/cm$^2$ (cumulative light quantity: 20000 mJ/cm$^2$). In this way, the B-staged product layer was formed on the surface of the silicon wafer. Subsequently, a silicon bare chip resembling a semiconductor chip (3 mm long×3 mm wide×750 μm thick) was placed on the B-staged product layer using a die bonding apparatus, and pressed at 40° C. under the condition of 0.1 MPa for 1 second to obtain a laminate (1) of the silicon wafer, the B-staged product layer, and the silicon bare chip. Subsequently, the laminate (1) was placed in an oven at 170° C. and heated for 1 hour to thermally cure the B-staged product layer. In this way, a laminate (2) of the silicon wafer, the bonding portion (the curable composition and the photocured and thermoset product layer), and the silicon bare chip was obtained. The die shear strength of the laminate (2) was measured using a die shear strength measuring apparatus ("Dage Series 4000" manufactured by Dage Japan Co., Ltd.) under the condition of a test temperature of 260° C.

<Determination Criteria for Adhesiveness (Die Shear Strength at 260° C.)>

O: The Die shear strength at 260° C. is 20 N or more.

Δ: The Die shear strength at 260° C. is 11 N or more and less than 20 N.

X: The Die shear strength at 260° C. is less than 11 N.

(4) Sealability (Moisture Absorption Reflow Test and Mold Test)

A structure was prepared in which electronic components (semiconductor chips) having a size of 1 mm long×1 mm wide×0.25 mm thick were mounted on a BGA substrate (thickness: 0.3 mm, organic substrate) at 40 locations in 4 rows×10 columns. A commercially available solder resist is applied to the surface of the structure. The BGA substrate corresponds to the following first member, and the electronic component corresponds to the following second member.

Preparation of Electronic Component for Evaluation:

The obtained curable composition was applied onto a surface of a first member using an inkjet device to form a curable composition layer (application step). Subsequently, the curable composition layer was irradiated with light, and curing of the curable composition layer was allowed to proceed to form a B-staged product layer (photocuring step). Light irradiation in the photocuring step was performed under the condition of 2000 mW/cm$^2$×0.1 seconds using a UV-LED lamp having a main wavelength of 365 nm. The application step and the photocuring step were repeated in the thickness direction of the curable composition layer to form a B-staged product layer in contact with the side surface of the second member. In this way, a laminated structure including the first member, the second member, and the B-staged product layer was obtained. Subsequently, the obtained laminated structure was placed in an oven at 170° C. and heated for 1 hour to thermally cure the B-staged product layer (thermal curing step). In this way, a laminated structure including the first member, the second member, and the bonding portion (the curable composition and the photocured and thermoset product layer) was obtained. Subsequently, a resin was disposed outside the bonding portion, and a mold resin portion was formed under the conditions of 150° C., 3 MPa, and 300 seconds to obtain an electronic component for evaluation.

Moisture Absorption Reflow Test and Mold Test:

The obtained electronic component for evaluation was left to stand for 168 hours under the conditions of 85° C. and a humidity of 85 RH % to absorb moisture. Subsequently, the electronic component for evaluation was passed through a solder reflow furnace (preheat 150° C.×100 seconds, reflow [maximum temperature 260° C.]) for 5 cycles. Subsequently, the electronic component for evaluation was observed using an ultrasonic inspection imaging device ("mi-scope hyper II" manufactured by Hitachi Kenki Finetech Co., Ltd.), and it was checked whether or not the mold resin entered the air cavity of the electronic component for evaluation. The sealability (moisture absorption reflow test and mold test) was evaluated according to the following criteria.

<Determination Criteria for Sealability (Moisture Absorption Reflow Test and Mold Test)>

O: The number of electronic components for evaluation in which the mold resin entered the air cavity is 0 among 40 electronic components for evaluation.

Δ: The number of electronic components for evaluation in which the mold resin entered the air cavity is 1 or more and 10 or less among 40 electronic components for evaluation.

X: The number of electronic components for evaluation in which the mold resin entered the air cavity was 11 or more among 40 electronic components for evaluation.

Compositions and results are shown in Tables 1 to 5 below.

TABLE 1

| | | | | Example 1 | Example 2 | Example 3 | Example 4 | Example 5 | Example 6 |
|---|---|---|---|---|---|---|---|---|---|
| (A) Photocurable compound | Monofunctional (meth)acrylate compound 1 | AEH | wt. % | 19 | 17 | 20 | 13 | 15 | 14 |
| | Monofunctional (meth)acrylate compound 2 | IBOA | wt. % | | | | | | |
| | Bifunctional (meth)acrylate compound 1 | ABE-300 | wt. % | 4 | 6 | 3 | 10 | | |
| | Bifunctional (meth)acrylate compound 2 | IRR-214K | wt. % | | | | | | 5 |
| | Bifunctional (meth)acrylate compound 3 | UA4400 | wt. % | | | | | 7 | |
| | Trifunctional (meth)acrylate compound | TMPTA | wt. % | | | | | | |
| | Hexafunctional (meth)acrylate compound | DPHA | wt. % | | | | | | |
| (B) Thermosetting compound | Bifunctional epoxy compound 1 | YD127 | wt. % | 20 | 20 | 20 | 20 | | 23 |
| | Bifunctional epoxy compound 2 | JER630 | wt. % | | | | | 21 | |
| | Bifunctional epoxy compound 3 | YDF-170 | wt. % | | | | | | |
| | Bifunctional epoxy compound 4 | EP-4088S | wt. % | | | | | | |
| (C) Photocurable and thermosetting compound | | 4HBAGE | wt. % | 31 | 31 | 31 | 31 | 31 | 31 |
| Photopolymerization initiator | Photopolymerization initiator 1 | Irgacure379 | wt. % | 8 | 8 | 8 | 8 | 8 | 8 |
| | Photopolymerization initiator 2 | Irgacure369 | wt. % | | | | | | |
| Thermal curing agent | Thermal curing agent 1 | APBN | wt. % | 17 | 17 | 17 | 17 | 17 | 18 |
| | Thermal curing agent 2 | 4,4'-DADPE | wt. % | | | | | | |
| Coupling agent | | KBM503 | wt. % | 1 | 1 | 1 | 1 | 1 | 1 |
| | Total | | wt. % | 100 | 100 | 100 | 100 | 100 | 100 |
| | Viscosity at 40° C. of B-staged product | | Pa · s | 800 | 1200 | 650 | 6500 | 250 | 7500 |
| | Formability of cured product layer having high aspect ratio | | — | ○ | ○ | ○ | ○ | Δ | ○ |
| | Adhesiveness (die shear strength at 260° C.) | | N | 25 | 25 | 30 | 20 | 30 | 20 |
| | | | — | ○ | ○ | ○ | ○ | ○ | ○ |
| | Sealability (moisture absorption reflow test and mold test) | | — | ○ | ○ | ○ | ○ | Δ | ○ |

TABLE 2

| | | | | Example 7 | Example 8 | Example 9 | Example 10 | Example 11 |
|---|---|---|---|---|---|---|---|---|
| (A) Photocurable compound | Monofunctional (meth)acrylate compound 1 | AEH | wt. % | 15 | 15 | 30 | 33 | 30 |
| | Monofunctional (meth)acrylate compound 2 | IBOA | wt. % | | | | | |
| | Bifunctional (meth)acrylate compound 1 | ABE-300 | wt. % | 8 | | 6 | | 10 |
| | Bifunctional (meth)acrylate compound 2 | IRR-214K | wt. % | | 2 | | 2 | |
| | Bifunctional ([meth)acrylate compound 3 | UA4400 | wt. % | | | | | |
| | Trifunctional (meth)acrylate compound | TMPTA | wt. % | | | | | |
| | Hexafunctional (meth)acrylate compound | DPHA | wt. % | | | | | |
| (B) Thermosetting compound | Bifunctional epoxy compound 1 | YD127 | wt. % | 20 | 23 | 35 | 36 | 31 |
| | Bifunctional epoxy compound 2 | JER630 | wt. % | | | | | |
| | Bifunctional epoxy compound 3 | YDF-170 | wt. % | | | | | |
| | Bifunctional epoxy compound 4 | EP-4088S | wt. % | | | | | |
| (C) Photocurable and thermosetting compound | | 4HBAGE | wt. % | 31 | 32 | | | |
| Photopolymerization initiator | Photopolymerization initiator 1 | Irgacure379 | wt. % | 8 | 8 | 8 | 8 | 8 |
| | Photopolymerization initiator 2 | Irgacure369 | wt. % | | | | | |
| Thermal curing agent | Thermal curing agent 1 | APBN | wt. % | 17 | 19 | 20 | 20 | 20 |
| | Thermal curing agent 2 | 4,4'-DADPE | wt. % | | | | | |
| Coupling agent | | KBM503 | wt. % | 1 | 1 | 1 | 1 | 1 |
| | Total | | wt. % | 100 | 100 | 100 | 100 | 100 |
| | Viscosity at 40° C. of B-staged product | | Pa · s | 3000 | 250 | 550 | 350 | 750 |
| | Formability of cured product layer having high aspect ratio | | — | ○ | Δ | Δ | Δ | Δ |
| | Adhesiveness (die shear strength at 260° C.) | | N | 20 | 30 | 30 | 30 | 30 |
| | | | — | ○ | ○ | ○ | ○ | ○ |
| | Sealability (moisture absorption reflow test and mold test) | | — | ○ | Δ | ○ | ○ | ○ |

TABLE 3

| | | | | Example 12 | Example 13 | Example 14 | Example 15 | Example 16 | Example 17 |
|---|---|---|---|---|---|---|---|---|---|
| (A) Photocurable compound | Monofunctional (meth)acrylate compound 1 | AEH | wt. % | | | | | | |
| | Monofunctional (meth)acrylate compound 2 | IBOA | wt. % | 9 | | 9 | 15 | 9 | 9 |
| | Bifunctional (meth)acrylate compound 1 | ABE-300 | wt. % | | | | | | |
| | Bifunctional (meth)acrylate compound 2 | IRR-214K | wt. % | 7 | 8 | 12 | 4 | 7 | 7 |
| | Bifunctional ([meth)acrylate compound 3 | UA4400 | wt. % | | | | | | |
| | Trifunctional (meta)acrylate compound | TMPTA | wt. % | | | | | | |
| | Hexafunctional (meth)acrylate compound | DPHA | wt. % | 7 | 15 | 2 | 4 | 7 | 7 |

TABLE 3-continued

| | | | | Example 12 | Example 13 | Example 14 | Example 15 | Example 16 | Example 17 |
|---|---|---|---|---|---|---|---|---|---|
| (B) Thermosetting compound | Bifunctional epoxy compound 1 | YD127 | wt. % | | | | | | |
| | Bifunctional epoxy compound 2 | JER630 | wt. % | | | | | | |
| | Bifunctional epoxy compound 3 | YDF-170 | wt. % | 20 | 20 | 20 | 20 | 10 | 5 |
| | Bifunctional epoxy compound 4 | EP-4088S | wt. % | | | | | | |
| (C) Photocurable and thermosetting compound | | 4HBAGE | wt. % | 31 | 31 | 31 | 31 | 41 | 46 |
| Photopolymerization initiator | Photopolymerization initiator 1 | Irgacure379 | wt. % | 8 | 8 | 8 | 8 | 8 | 8 |
| | Photopolymerization initiator 2 | Irgacure369 | wt. % | | | | | | |
| Thermal curing agent | Thermal curing agent 1 | APBN | wt. % | 17 | 17 | 17 | 17 | 17 | 17 |
| | Thermal curing agent 2 | 4,4'-DADPE | wt. % | | | | | | |
| Coupling agent | | KBM503 | wt. % | 1 | 1 | 1 | 1 | 1 | 1 |
| Total | | | wt. % | 100 | 100 | 100 | 100 | 100 | 100 |
| Viscosity at 40° C. of B-staged product | | | Pa · s | 20,000 | 65,000 | 12,000 | 10,000 | 25,000 | 30,000 |
| Formability of cured product layer having high aspect ratio | | | — | ○○ | ○○ | ○ | ○ | ○○ | ○○ |
| Adhesiveness (die shear strength at 260° C.) | | | N | 25 | 20 | 30 | 30 | 17 | 11 |
| | | | — | ○ | ○ | ○ | ○ | Δ | Δ |
| Sealability (moisture absorption reflow test and mold test) | | | — | ○ | ○ | ○ | ○ | Δ | Δ |

20

TABLE 4

| | | | | Example 18 | Example 19 | Example 20 | Example 21 | Example 22 |
|---|---|---|---|---|---|---|---|---|
| (A) Photocurable compound | Monofunctional (meth)acrylate compound 1 | AEH | wt. % | | | | | |
| | Monofunctional (meth)acrylate compound 2 | IBOA | wt. % | 9 | | | 9 | 9 |
| | Bifunctional (meth)acrylate compound 1 | ABE-300 | wt. % | | | | | |
| | Bifunctional (meth)acrylate compound 2 | IRR-214K | wt. % | 7 | 50 | 30 | 7 | 7 |
| | Bifunctional (meth)acrylate compound 3 | UA4400 | wt. % | | | | | |
| | Trifunctional (meth)acrylate compound | TMPTA | wt. % | 7 | | | | |
| | Hexafunctional (meth)acrylate compound | DPHA | wt. % | | | 15 | 7 | 7 |
| (B) Thermosetting compound | Bifunctional epoxy compound 1 | YD127 | wt. % | | | | | |
| | Bifunctional epoxy compound 2 | JER630 | wt. % | | | | | |
| | Bifunctional epoxy compound 3 | YDF-170 | wt. % | 20 | 20 | 32 | | |
| | Bifunctional epoxy compound 4 | EP-4088S | wt. % | | | | 20 | 20 |
| (C) Photocurable and thermosetting compound | | 4HBAGE | wt. % | 31 | 8 | | 31 | 31 |
| Photopolymerization initiator | Photopolymerization initiator 1 | Irgacure379 | wt. % | 8 | 8 | 8 | 8 | 8 |
| | Photopolymerization initiator 2 | Irgacure369 | wt. % | | | | | |
| Thermal curing agent | Thermal curing agent 1 | APBN | wt. % | 17 | 13 | 14 | 17 | |
| | Thermal curing agent 2 | 4,4'-DADPE | wt. % | | | | | 17 |
| Coupling agent | | KBM503 | wt. % | 1 | 1 | 1 | 1 | 1 |
| Total | | | wt. % | 100 | 100 | 100 | 100 | 100 |
| Viscosity at 40° C. of B-staged product | | | Pa · s | 16,000 | 300,000 | 1,000,000 | 20,000 | 20,000 |
| Formability of cured product layer having high aspect ratio | | | — | ○ | ○○ | ○○ | ○○ | ○○ |
| Adhesiveness (die shear strength at 260° C.) | | | N | 25 | 15 | 15 | 25 | 25 |
| | | | — | ○ | Δ | Δ | ○ | ○ |
| Sealability (moisture absorption reflow test and mold test) | | | — | ○ | Δ | Δ | ○ | ○ |

TABLE 5

| | | | | Comparative Example 1 | Comparative Example 2 | Comparative Example 3 | Comparative Example 4 | Comparative Example 5 |
|---|---|---|---|---|---|---|---|---|
| (A) Photocurable compound | Monofunctional (meth)acrylate compound 1 | AEH | wt. % | 23 | 34 | 20 | 12 | 16 |
| | Monofunctional (meth)acrylate compound 2 | IBOA | wt. % | | | | | |
| | Bifunctional (meth)acrylate compound 1 | ABE-300 | wt. % | | 11 | | 1 | |
| | Bifunctional (meth)acrylate compound 2 | IRR-214K | wt. % | | | 1 | | 1 |
| | Bifunctional (meth)acrylate compound 3 | UA4400 | wt. % | | | 9 | | |
| | Trifunctional (meth)acrylate compound | TMPTA | wt. % | | | | | |
| | Hexafunctional (meth)acrylate compound | DPHA | wt. % | | | | | |
| (B) Thermosetting compound | Bifunctional epoxy compound 1 | YD127 | wt. % | 20 | 4 | | 10 | 23 |
| | Bifunctional epoxy compound 2 | JER630 | wt. % | | | | | |
| | Bifunctional epoxy compound 3 | YDF-170 | wt. % | | | | | |
| | Bifunctional epoxy compound 4 | EP-4088S | wt. % | | | | | |
| (C) Photocurable and thermosetting compound | | 4HBAGE | wt. % | 31 | 31 | 45 | 50 | 32 |
| Photo- | Photopolymerization initiator 1 | Irgacure379 | wt. % | 8 | 8 | 10 | | 8 |

TABLE 5-continued

| | | | | Comparative Example 1 | Comparative Example 2 | Comparative Example 3 | Comparative Example 4 | Comparative Example 5 |
|---|---|---|---|---|---|---|---|---|
| polymerization initiator | Photopolymerization initiator 2 | Irgacure369 | wt. % | | | | 6 | |
| Thermal curing agent | Thermal curing agent 1 | APBN | wt. % | 17 | 11 | 14 | 20 | 19 |
| | Thermal curing agent 2 | 4,4'-DADPE | wt. % | | | | | |
| Coupling agent | | KBM503 | wt. % | 1 | 1 | 1 | 1 | 1 |
| | Total | | wt. % | 100 | 100 | 100 | 100 | 100 |
| | Viscosity at 40° C. of B-staged product | | Pa · s | 20 | 7500 | 4500 | 150 | 240 |
| | Formability of cured product layer having high aspect ratio | | — | X | ○ | ○ | X | X |
| | Adhesiveness (die shear strength at 260° C.) | | N | 30 | 10 | 5 | 30 | 30 |
| | | | — | ○ | X | X | ○ | ○ |
| | Sealability (moistare absorption reflow test and mold test) | | — | X | X | X | ○ | ○ |

EXPLANATION OF SYMBOLS

1: First member
2: Second member
3: Bonding portion
3A: Curable composition layer
3B: B-staged product layer
10: Electronic component
41: Solder ball
42: Resin sheet
43: Connection terminal
44: Mold resin portion
51: Ejection portion
52: Light irradiation unit
R: Air cavity

The invention claimed is:

1. A curable composition for inkjet and air cavity formation, comprising:

a photocurable compound having a (meth)acryloyl group or a vinyl group and having no cyclic ether group; and a thermosetting compound having no (meth)acryloyl group and having a cyclic ether group, a content of the thermosetting compound in 100 wt % of the curable composition for inkjet and air cavity formation being 5 wt % or more, and when a B-staged product is obtained by irradiating the curable composition for inkjet and air cavity formation with light having a wavelength of 365 nm at an illuminance of 2000 mW/cm$^2$, a viscosity at 40° C. of the B-staged product being 2.5×10$^2$ Pa·s or more and 3.0×10$^6$ Pa·s or less.

2. The curable composition for inkjet and air cavity formation according to claim 1, wherein the photocurable compound includes a first photocurable compound having one, in total, of a (meth)acryloyl group and a vinyl group and a second photocurable compound having two or more, in total, of a (meth)acryloyl group and a vinyl group.

3. The curable composition for inkjet and air cavity formation according to claim 2, wherein the first photocurable compound is a photocurable compound having one (meth) acryloyl group, and the second photocurable compound is a photocurable compound having two or more (meth)acryloyl groups.

4. The curable composition for inkjet and air cavity formation according to claim 2, comprising or not comprising a photocurable and thermosetting compound having a (meth)acryloyl group and having a cyclic ether group, wherein when the curable composition does not comprise the photocurable and thermosetting compound, a content of the second photocurable compound in 100 wt % of the photocurable compound is 5 wt % or more and 25 wt % or less, and when the curable composition comprises the photocurable and thermosetting compound, a content of the second photocurable compound in 100 wt % of a total content of the photocurable compound and the photocurable and thermosetting compound is 4 wt % or more and 20 wt % or less.

5. The curable composition for inkjet and air cavity formation according to claim 1, comprising a thermal curing agent.

6. The curable composition for inkjet and air cavity formation according to claim 5, wherein the thermal curing agent contains an amine compound.

7. An electronic component comprising:

a first member;

a second member; and a bonding portion bonding an upper surface of the first member and a side surface or a lower surface of the second member, an air cavity being formed by the first member, the second member, and the bonding portion, and the bonding portion being a cured product of the curable composition for inkjet and air cavity formation according to claim 1.

8. The electronic component according to claim 7, wherein a ratio of a height of the bonding portion to a width of the bonding portion is 1.0 or more.

9. A method for manufacturing an electronic component, comprising:

an application step of applying the curable composition according to claim 1 onto a surface of a first member using an inkjet device to form a curable composition layer;

a photocuring step of allowing curing of the curable composition layer to proceed by light irradiation to form a B-staged product layer; and a thermal curing step of thermally curing the B-staged product layer by heating, in the application step and the photocuring step, application and photocuring being repeated in a thickness direction of the curable composition layer to form a B-staged product layer in contact with a side surface or a lower surface of a second member.

* * * * *